United States Patent [19]
McIntyre

[11] Patent Number: 5,831,302
[45] Date of Patent: Nov. 3, 1998

[54] VOLTAGE REFERENCE CIRCUIT

[75] Inventor: David Hugh McIntyre, Bishopston, United Kingdom

[73] Assignee: SGS-Thomson Microelectronics Limited, Bristol, United Kingdom

[21] Appl. No.: 559,490

[22] Filed: Nov. 15, 1995

[30] Foreign Application Priority Data

Nov. 15, 1994 [GB] United Kingdom .................... 9423046

[51] Int. Cl.⁶ ................................ G05F 3/16; G05F 3/20
[52] U.S. Cl. ............................................ 323/313; 365/226
[58] Field of Search .................................... 323/313, 314; 365/226

[56] References Cited

U.S. PATENT DOCUMENTS

| | | | |
|---|---|---|---|
| 4,975,883 | 12/1990 | Baker et al. | 365/226 |
| 5,109,187 | 4/1992 | Guliani | 323/313 |
| 5,159,206 | 10/1992 | Tsay et al. | 327/143 |
| 5,267,213 | 11/1993 | Sung et al. | 365/226 |
| 5,287,011 | 2/1994 | Koshikawa et al. | 307/272.3 |
| 5,345,422 | 9/1994 | Redwine | 365/226 |
| 5,367,249 | 11/1994 | Honnigford | 323/313 |
| 5,376,832 | 12/1994 | Gariboldi et al. | 365/226 |

FOREIGN PATENT DOCUMENTS

| | | | |
|---|---|---|---|
| A-0 260 474 | 3/1988 | European Pat. Off. | G05F 1/46 |
| A-0 385 469 | 9/1990 | European Pat. Off. | G11C 5/14 |
| A-0 470 498 | 2/1992 | European Pat. Off. | G11C 5/14 |

Primary Examiner—Stuart N. Hecker
Attorney, Agent, or Firm—David M. Driscoll; James H. Morris

[57] ABSTRACT

The voltage reference circuit is provided particularly but not exclusively for use in flash EPROM chips. The reference circuit is intended to be inhibited until proper start-up conditions have been established to allow the reference circuit to operate properly. This is achieved by incorporating an enable signal generating circuit which is responsive to start-up circuitry for generating an enable signal at an appropriate signal level.

18 Claims, 5 Drawing Sheets

VOLTAGE REFERENCE CIRCUIT

FIELD OF THE INVENTION

This invention relates to a voltage reference circuit.

BACKGROUND TO THE INVENTION

The invention is particularly but not exclusively concerned with a reference circuit for use in a voltage detection circuit for detecting the power supply for flash EPROM chips. A voltage detection circuit is needed for these chips to prevent programming or erasing of the flash memory when the normal power supply voltage Vcc is below a safe value (normally referred to as VLKO in the data sheet). This is because when the power supply voltage is below a certain value, the memory chip may not operate reliably, which could cause programming and/or erasing of random memory cells.

Flash memory chips also require a high voltage power supply Vpp of about 12V for programming the memory, and it can be desirable to provide a detection circuit for that voltage as well.

For flash memory chips capable of operating with the power supply voltage at either 3.3V or 5V, it is also desirable for the voltage detection circuit to determine the power supply voltage range.

A known voltage detection circuit is shown in FIG. 1. This circuit includes a comparator 2 having a minus input 4 to which is supplied a voltage V1 derived from the power supply voltage Vcc through a resistive chain comprising resistors R1 and R2. The comparator 2 also has a plus input 6 which receives a voltage reference VREF. The comparator is operable to change the logic state of its output signal VDETECT depending on whether or not V1 exceeds VREF. If V1 is greater than VREF, VDETECT remains low. However, if V1 is less than VREF, VDETECT goes high, indicating that the power supply voltage Vcc has not yet reached its correct value. The reference voltage and the ratio between resistors $R_1$, $R_2$ are set at a suitable value for comparison depending on the desired level of the power supply voltage.

A similar detection circuit can be used to detect if the operating power supply range is 3.3V plus or minus 0.3V or 5V plus or minus 0.5V. To do this, the voltage detection circuit must generate an output signal VDETECT which switches between 3.6V and 4.5V. In this case, the output signal VDETECT is used to reconfigure parts of the internal circuitry of a flash memory chip depending on the power supply range.

In FIG. 1, the voltage V1 derived from the power supply voltage is essentially independent of temperature or process variations, because it is obtained from a resistor divider. However, any variation in the reference voltage VREF will produce an unwanted variation in the voltage detection level. It is therefore one object of the invention to select a good reference source for the voltage reference VREF.

In addition, the reference voltage VREF is required to operate reliably during power transitions, otherwise the voltage detection circuit may fail to operate properly just when it is needed most. It is another object of the present invention to provide a voltage detection circuit which operates reliably during power transitions.

SUMMARY OF THE INVENTION

The present invention resides in one aspect in using a bandgap reference circuit to generate the reference voltage for a voltage detection circuit. As is well known in the art, a bandgap reference circuit may include an operational amplifier having a plus input and a minus input. An output signal of the operational amplifier supplies a feedback current to first and second resistive chains. This can be achieved by a p-channel output transistor which has its source connected to an upper power supply voltage rail and its drain connected to supply the feedback current. The gate of the p-channel output transistor is connected to receive the output signal of the operational amplifier. The first resistive chain includes a first resistor and a second resistor connected in series with a first diode-connected bipolar transistor. The second resistive chain comprises a single resistor connected in series with a second diode-connected bipolar transistor. The plus input of the operational amplifier receives its input from a node intermediate the first and second resistors of the first resistive chain. The minus input of the operational amplifier receives its input from a node intermediate the resistor of the second resistive chain and the emitter of the second bipolar transistor. The collectors of the bipolar transistors are connected to the lower supply rail, which will normally be at ground. The reference voltage generated by the bandgap circuit is derived from the reference level at an output node at the junction of the first and second resistive chains.

Operation of the bandgap reference circuit is well known to a person skilled in the art and is therefore only discussed briefly herein. The first bipolar transistor is designed to have an emitter area which is several times larger than the emitter area of the second bipolar transistor. The base emitter voltage Vbe across the bipolar transistors varies linearly between 0.8V and 0.4V when the temperature varies from minus 55° C. to 150° C. As the emitter area of the first bipolar transistor is larger than the emitter area of the second bipolar transistor but the current through it is the same, the first bipolar transistor has a lower base emitter voltage across it. The resistors of the first and second resistive chains, together with the operational amplifier, amplify this voltage difference by a suitable voltage and add it to the original base emitter voltage to produce a constant output reference voltage $V_{BG}$. This is a very good reference because it does not depend on temperature or on the power supply voltage.

The bandgap reference circuit includes start-up circuitry for starting up the reference circuit. However, for so-called slow ramps (greater than about 10 μs), it can take a finite period of time for a power supply voltage supplied to the reference circuit to ramp up from a power-down value (typically 0V) to a predetermined level sufficient to ensure proper operation of the start-up circuit. During this initialisation phase, the reference circuit behaves unreliably. Moreover, if the power supply voltage never reaches the predetermined level it would be useful to prevent further use of the reference circuit.

For so-called fast ramp voltages, of the order of one to ten us, even though the power supply voltage rapidly reaches a required level, signals for the proper start-up of the reference circuit may not yet have been established. It is desirable in this case to prevent use of the reference circuit until start-up conditions have been established.

According to one aspect of the present invention there is provided a reference circuit arranged to generate at a reference node a reference voltage which reference circuit includes start-up circuitry for starting up said reference circuit wherein said start-up circuitry includes an analogue signal reference generating circuit for generating an analogue reference signal which is at a first level in a power-down state and which changes after initiating a power-up state to a second level indicative that adequate start-up conditions have been established; and an enable signal generating circuit responsive to said analogue reference signal for generating an enable signal when said analogue reference signal is at the second level.

In the described embodiment the reference circuit is connected between upper and lower power supply rails. The reference circuit can include a power-up/power-down detection device which is responsive to a power-down signal. Thus, it will be appreciated that entry into the power-up state from the power-down state can be initiated either by applying a power supply potential between the upper and lower power supply rails or by changing the state of the power-down signal. In both of these situations a ramp voltage is seen by the reference circuit and the start-up circuitry.

The enable signal generating circuit preferably includes a detection device for generating said enable signal only when the power supply voltage has reached a predetermined level. This is particularly important in the case of so-called slow ramp voltages. The detection device can be a native p-channel transistor.

The provision of such an enable signal generating circuit ensures that an enable signal is only generated when the power supply voltage has reached the predetermined level and the analogue reference signal is at a level sufficient to ensure proper operation of the start-up circuitry. Thus, before this time has been reached, or if this time is not reached at all, it is possible for other circuitry to be disabled so that it does not operate in an unreliable zone.

In the described embodiment, the analogue signal reference generating circuit includes a first resistive transistor connected between a first voltage and a reference output node and a second diode connected transistor connected between a second voltage and the reference output node, whereby the analogue reference signal increases as the power supply voltage increases, the second level of the analogue reference signal being determined by the threshold voltage of the diode connected transistor. In the described embodiment, the first voltage is the power supply voltage and the second voltage is ground. There can be two diode connected transistors arranged in series so that the second level is two threshold voltages, or approximately 2 to 2.2V.

The reference circuit of the present invention is particularly useful in a voltage detection circuit which comprises a comparator for receiving at one input an input voltage derived from a voltage to be detected and at another input a reference voltage derived from a reference circuit according to the invention. In this situation, the comparator can receive the enable signal from the enable signal generating circuit so that it is disabled before the reference circuit has properly started up. This ensures that the comparator does not generate false signals at a critical time during ramp-up of the power supply voltage.

The present invention is particularly useful in the case where the voltage to be detected is the power supply voltage. After application of the power supply voltage to the reference circuit, it begins to start up but it may still take a few micro seconds to reach a stabilised reference level. If during this period the reference voltage is below its correct value, there is a danger that a much lower than normal level of the power supply voltage could be detected as adequate by the voltage detection circuit.

To prevent this, an embodiment of the invention can further comprise a lock signal generating circuit for generating a lock signal which is maintained at a first logic level during start-up of the reference circuit and then attains a second logic level when the reference value has stabilised; and a lock transistor having a controllable node connected to receive said lock signal and a controllable path connected between a start-up voltage level and said reference node, said start-up voltage level being at least as high as said stable reference value whereby the reference voltage is held at said start up voltage level during start-up of the circuit.

The start-up voltage level can conveniently be derived from a power supply voltage for the reference circuit, since the power supply voltage will always be higher than the stable reference value of the reference voltage generated by the circuit.

The lock signal generating circuit can include start-up circuitry for generating a start-up signal at said first logic level during start-up and a lock generator comprising first and second inverters, the first inverter being coupled to receive said start-up signal and the second inverter being arranged to generate said lock signal.

This arrangement has the advantage that the lock signal generated by the lock generator turns on the lock transistor harder and faster than using the start-up signal itself. Thus, the lock transistor is activated to hold the reference voltage at the start-up voltage level at a very short time after the reference circuit has been turned on.

Preferably, the first inverter is skewed to have a high trip point so that the start-up signal does not have to go fully low to activate the lock generator.

The lock transistor can be a p-channel MOSFET device with its gate connected to receive the lock signal, its source connected to the start-up voltage level and its drain connected to the reference node.

When a power supply voltage is applied to the reference circuit to turn it on, there is an initial phase during which the power supply ramps up where the voltage at the reference node is unpredictable. The voltage at the reference node then rises slowly from some intermediate value to its correct stable value. During this start-up phase, when the start-up signal is low, the lock signal is generated so that it is also low and clamps the reference node to the start-up voltage level. This ensures that the reference voltage cannot be lower than the start-up voltage level. Where the start-up voltage level is taken from the power supply to the reference circuit, which is above the stable reference value, this means that the reference voltage will drop down from the start-up voltage level to its stable value, rather than rising from a lower value up to the stable value.

For a better understanding of the present invention and to show how the same may be carried into effect reference will now be made by way of example to the accompanying drawings.

DESCRIPTION OF THE PREFERRED EMBODIMENTS

Figure 1:
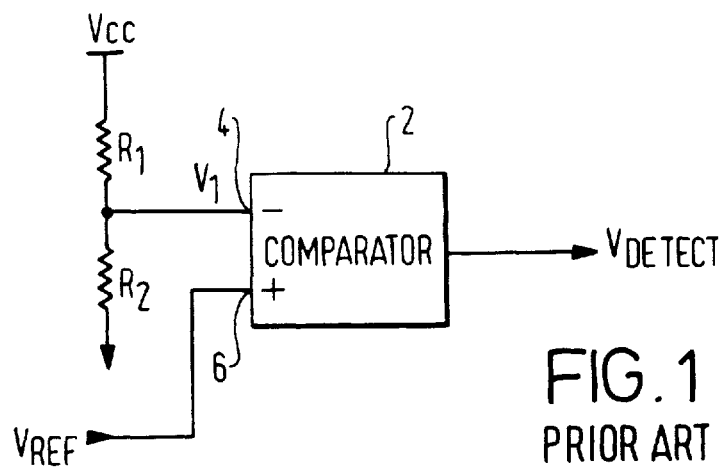
FIG. 1 is a diagram showing a voltage detection circuit according to the prior art.
Figure 2:
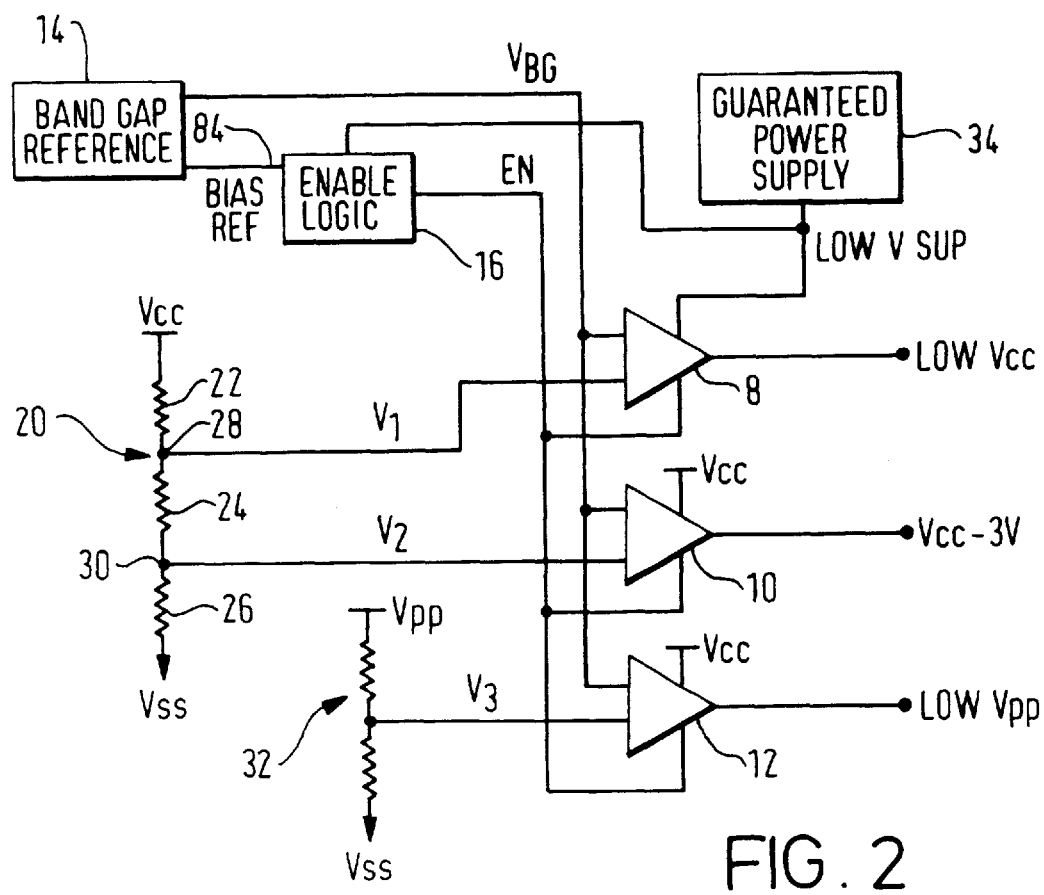
FIG. 2 is a block diagram of a detection circuit according to one embodiment of the present invention.

FIG. 2 shows a voltage detection circuit which is capable of detecting three different power supply levels. The voltage detection circuit includes first, second and third comparators 8,10,12. Each comparator receives a reference voltage $V_{BG}$ derived from a bandgap comparator reference circuit 14. Each of the comparators 8, 10 and 12 also receive an enable signal EN from enable logic 16. The enable signal EN is generated to disable the comparators 8, 10 and 12 during an initialise phase of the circuit as discussed more fully herein. The first comparator 8 is arranged to provide an output signal LOW Vcc which detects when the power supply voltage has fallen below an adequate level. To achieve this it compares its reference voltage $V_{BG}$ with a voltage V1 which is derived from the power supply voltage Vcc via a resistive chain 20 connected to a lower power supply rail Vss normally at ground. The resistive chain 20 comprises three resistors 22,24,26 and the voltage V1 is taken from a node 28 between the resistors 22 and 24.

The second comparator 10 provides an output signal Vcc3V which indicates the power supply operational range for the chip (i.e. 3V±0.3V or 5V±0.5V). To do this, the second comparator 10 receives an input voltage V2 from a second node 30 between resistors 24 and 26 in the resistive chain 20.

The third comparator 12 provides a signal LOW Vpp indicating failure of a second voltage supply Vpp, which is the voltage supply used for some operations of the chip and which is generally at a voltage higher than Vcc, and typically at 12V. To do this, the third comparator 12 has an input signal V3 derived from a resistive chain 32 connected between the second power supply voltage Vpp and Vss.

It will readily be appreciated that the present invention is applicable to the generation of any one or more of the output signals illustrated in FIG. 2 and is thus not restricted to the case where all three comparators are present.

The first comparator is supplied with a guaranteed power supply 34 which always maintains at least a minimum voltage denoted as the signal LOWV SUP in FIG. 2. The second and third comparators 10,12 each receive a power supply Vcc.

Figure 3:
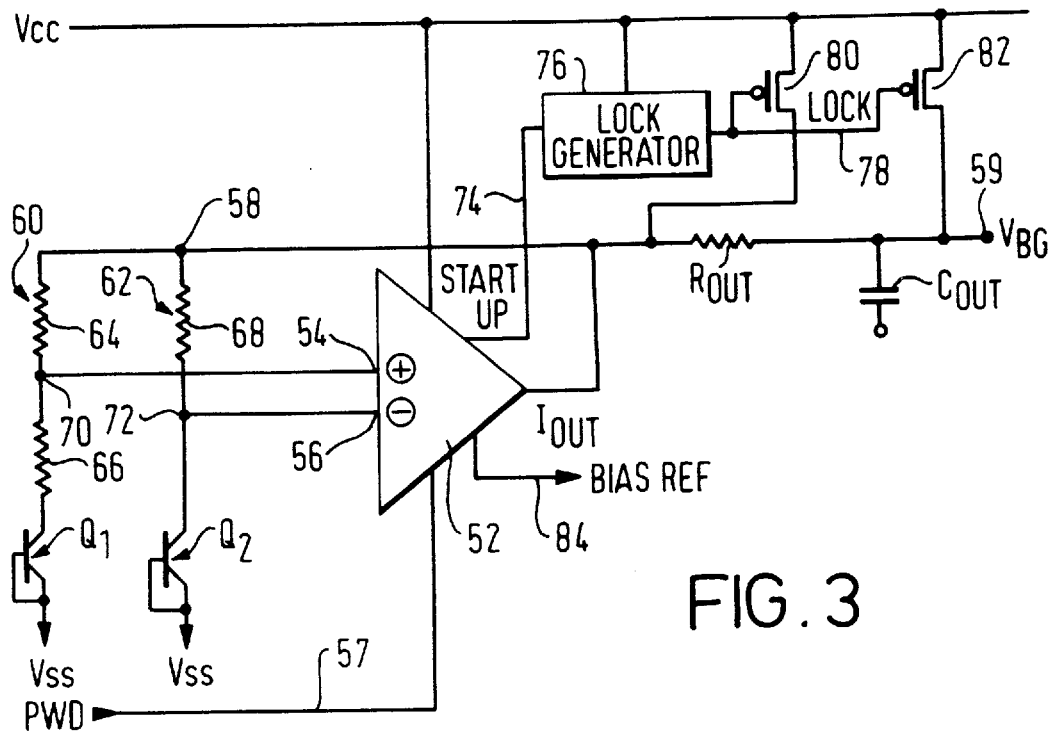
FIG. 3 is a circuit diagram illustrating a bandgap reference circuit with a lock generating circuit.

FIG. 3 illustrates a circuit diagram of the bandgap reference circuit 14. The bandgap reference circuit includes an operational amplifier 52 having a plus input 54 and a minus input 56. An output signal Iout of the operational amplifier 52 is supplied to a junction node 58 of first and second resistive chains 60,62. The first resistive chain 60 includes a first resistor 64, a second resistor 66 and a first diode-connected bipolar transistor Q1. The second resistive chain 62 includes a first resistor 68 and a second diode-connected bipolar transistor Q2. The plus input 54 of the operational amplifier 52 receives its input from a node 70 intermediate the first and second resistors 64,66 of the first resistive chain 60. The minus input 56 of the operational amplifier 52 receives its input from a node 72 intermediate the resistor 62 and the second bipolar transistor Q2 of the second resistive chain 62. The collectors of the bipolar transistors are connected to the lower voltage supply rail Vss, normally at ground. The operational amplifier receives the power supply voltage Vcc and can be powered down by a power down signal PWD on line 57. Operation of the bandgap reference circuit is well known to a person skilled in the art and has already been outlined in the introductory part of this text. Because of the feedback, the feedback signal Iout attains a stable reference level which is independent of temperature and operating conditions. The reference voltage $V_{BG}$ output at a reference node 59 from the bandgap reference circuit 14 is derived from the level at the junction node 58 via a filter comprising a resistor Rout and a capacitor Cout.

The operational amplifier 52 also contains circuitry to generate a start-up signal STARTUP and a bias ref signal BIAS REF. The start-up signal on line 74 is fed to a lock generator circuit 76. The lock generator circuit 76 receives its power supply from the upper power supply rail Vcc and generates a lock signal on line 78. The lock signal is fed to the gate of a first p-channel MOSFET 80 which is connected between the power supply voltage Vcc and the junction node 58 and also to a second p-channel MOSFET 82 which is connected between the power supply voltage Vcc and the reference node 59.

The signal BIAS REF on line 84 is supplied to the enable logic 16.

Figure 4:
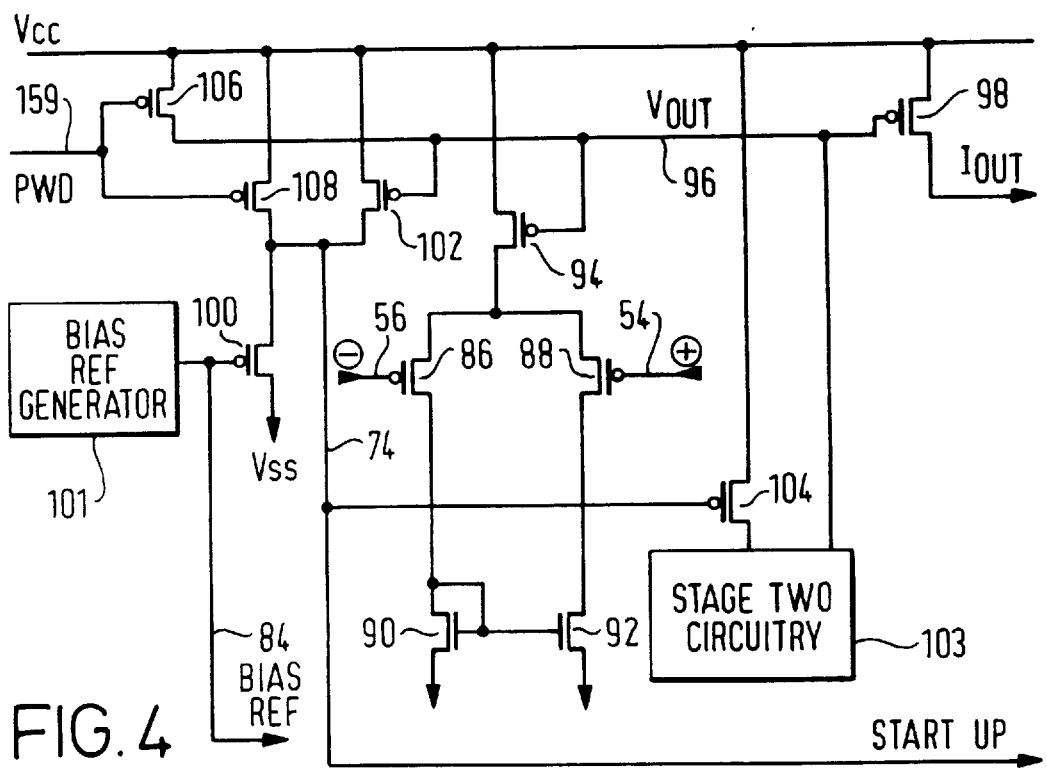
FIG. 4 is a transistor level diagram of a bandgap reference circuit with a start-up signal generating circuit.

FIG. 4 is a transistor level diagram of the operational amplifier 52. This comprises a known amplifier circuit in which stage one circuitry includes a long-tailed pair comprising source-connected p-channel transistors 86,88. Transistor 88 acts as the plus input 54 while transistor 86 acts as the minus input 56. The drains of the transistors 86,88 of the long-tailed pair are connected to respective current mirror transistors 90,92. The sources of the transistors 86,88 are connected in common to a p-channel transistor 94 which has its source connected to the power supply rail Vcc and its gate connected to an output line 96 of the amplifier circuit. The amplifier circuit includes stage two circuitry 103 which does not form part of the invention and is not discussed herein. The signal Vout on the output line 96 is supplied to the gate of a p-channel output transistor 98 which has its source connected to the power supply voltage Vcc and its drain connected to supply the feedback current.

The operational amplifier also includes start-up circuitry which is constituted by a bias reference generator circuit 101, a resist transistor 100, a bias transistor 102 and a start-up transistor 104. First and second power down control transistors 106,108 responsive to a control signal $\overline{PWD}$ on line 159 derived from the power-down signal PWD on line 57 are connected between the upper power supply rail Vcc and respectively the output line 96 and the resist transistor 100. Both the control transistors 106,108 receive the signal PWD at their gates.

The bias reference generator circuit 101 generates the signal BIAS REF on line 84 which provides the gate voltage for the resist transistor 100. The signal BIAS REF could be replaced by the power supply voltage Vcc but the circuit would not operate so well over a large range of power supply voltages.

The bias transistor 102 has its source connected to the power supply voltage Vcc and its gate connected to the output line 96 of the amplifier circuit. Its drain is connected in common with the drain of the second control transistor 108 to the start-up signal output line 74. The start-up transistor 104 has its gate connected to receive the start-up signal on line 74, its source connected to the power supply voltage Vcc and its drain connected to the stage two circuitry 103.

In normal operation, the bias transistor 102 acts as a current source and attempts to supply more current than the resist transistor 100 can sink, thereby maintaining the start-up signal on line 74 at a high level. However, during start-up the signal Vout on the output of the amplifier circuit 96 is high, so that the current through the p-channel transistors is essentially zero. Thus, the resist transistor 100 is able to pull the start-up signal on line 74 low. This in turn causes the start-up transistor 104 to be turned on, which pulls the stage two circuitry 103 high. This causes the signal Vout to go low which forces current through the p-channel transistors including the bias transistor. It also generates the feedback current Iout which is fed back through the resistive chains 60,62 to the plus and minus inputs of the amplifier.

The start-up signal 74 remains low until the bias transistor 102 has been turned on sufficiently hard to overcome the current sinking effects of the resist transistor 100. It changes its state to a high level once the circuit has correctly started up. The design of the circuit is such that the reference voltage $V_{BG}$ is by then at a sufficiently high voltage to ensure correct operation.

Figure 5:
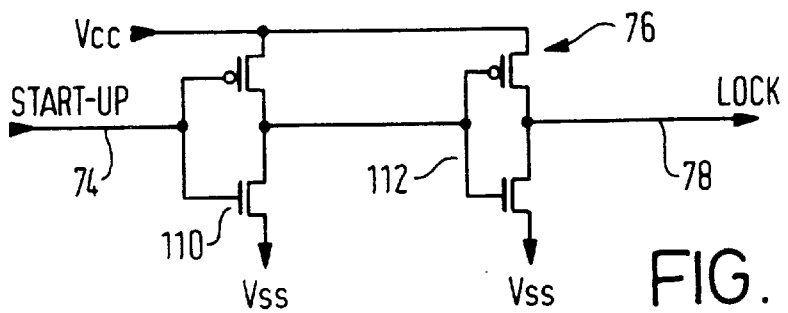
FIG. 5 is a transistor level diagram of a lock generating circuit.

FIG. 5 illustrates at transistor level the lock generator circuit 76. It comprises first and second inverters 110,112. The first inverter receives the start-up signal on line 74 and supplies its output to the second inverter which supplies as its output the lock signal on line 78. The inverters are connected between the power supply voltages Vcc and Vss. It will readily be appreciated that the circuit of FIG. 5 operates to generate the lock signal from the start-up signal so that whenever the device is in start-up, i.e. the start-up signal is low, the lock signal also goes low. Referring back to FIG. 3 will illustrate that when the lock signal goes low, the p-channel transistors 80 and 82 clamp the reference level at junction node 58 and reference node 59 respectively to Vcc.

In FIG. 5, the first inverter 110 has a high trip point so that the start-up signal on line 74 does not have to go fully low to activate the circuit. This has the advantage that the lock transistors 80,82 are turned on faster. However, non-skewed implementations are possible.

It will readily be appreciated that the start-up signal itself could be supplied directly to the p-channel transistors 80 and 82 to clamp the junction node 58 and reference node 59 to the power supply voltage Vcc during start-up. However, the provision of a separate lock generator circuit enables the lock transistors 80 and 82 to be turned on harder and faster than merely using the start-up signal itself.

It will be appreciated that while the junction node 58 rises from a power-down value to a stable reference value at a certain rate, the voltage at the reference node 59 will increase from a power-down value to a stable reference value at a slower rate, because of the effect of the RC time constant of the filter constituted by the resistor Rout and capacitor Cout. Therefore, although p-channel transistors 80 and 82 are illustrated in this circuit, it is to be noted that the most important effect of the invention is achieved by the p-channel transistor 82 which clamps the reference node 59 of the bandgap reference circuit during start-up. The p-channel transistor 80 is optional.

Figure 6:
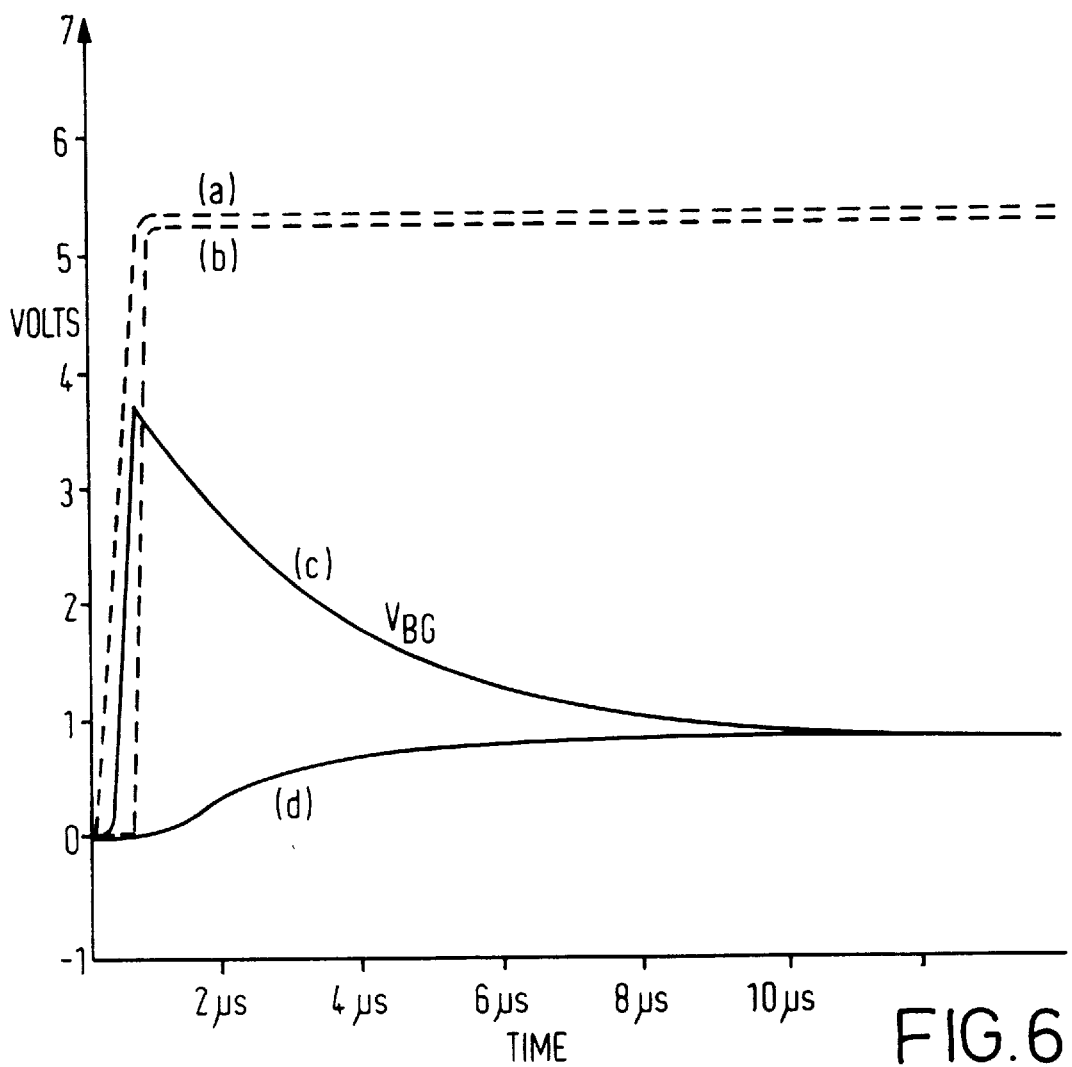
FIG. 6 is a graph of voltage against time for various signals.

The effect of the lock signal and lock transistor will now be described with reference to FIG. 6 which is a graph of voltage against time for various signals. In FIG. 6, graph (a) denotes the power supply voltage Vcc. Graph (b) denotes the lock signal. Graph (c) denotes the reference voltage $V_{BG}$ and graph (d) denotes the voltage which would prevail at the reference node in the absence of the lock transistor.

Vcc ramps up during an initialise phase to a constant level which will normally be at just above 5V. Graph (a) shows a fast ramp of 1us to full Vcc. The lock signal (graph (b)) remains low until the power supply voltage Vcc has reached its constant level and then goes high. While the lock signal is low, the lock transistors 80 and 82 are turned on so the reference voltage $V_{BG}$ follows the power supply voltage. When the lock signal goes high (at about 1us), the p-channel lock transistors are turned off allowing the reference voltage $V_{BG}$ to settle to its stable value of about 1.25V.

Graph (d) illustrates how the reference voltage might behave in the absence of the lock transistor. While the voltage supply Vcc is ramping up, there would be some fairly erratic and unpredictable behaviour which may result in the reference voltage rising from a low value to the stable reference level. As already explained, this is undesirable.

It will readily be appreciated that waveforms of the type illustrated in FIG. 6 can be a result either of application of the power supply potential between the power supply rails or by a change in state of the power-down signal, with Vcc remaining constant.

Figure 7:
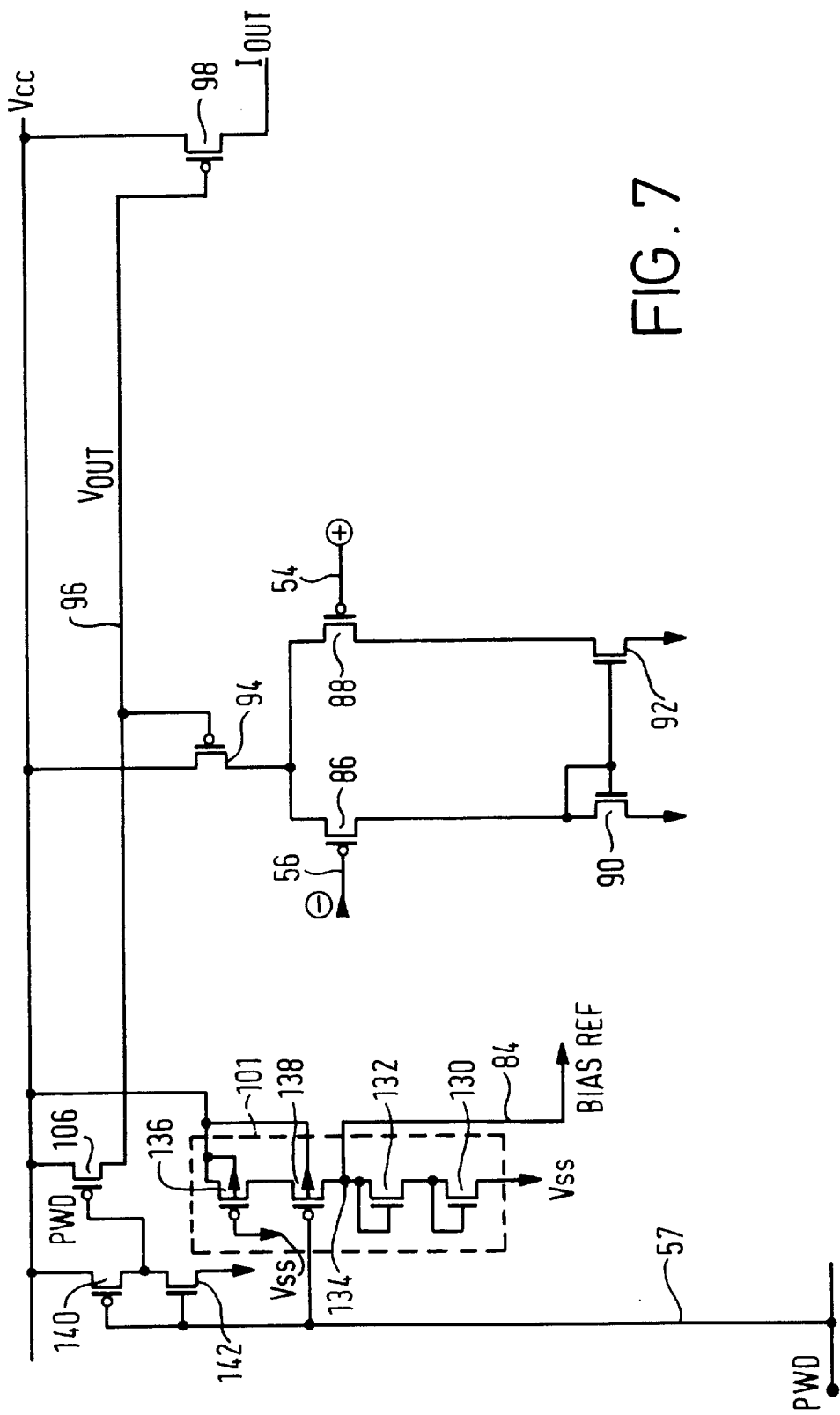
FIG. 7 is a simplified diagram of the circuit of FIG. 4 showing a bias reference generating circuit.
Figure 8:
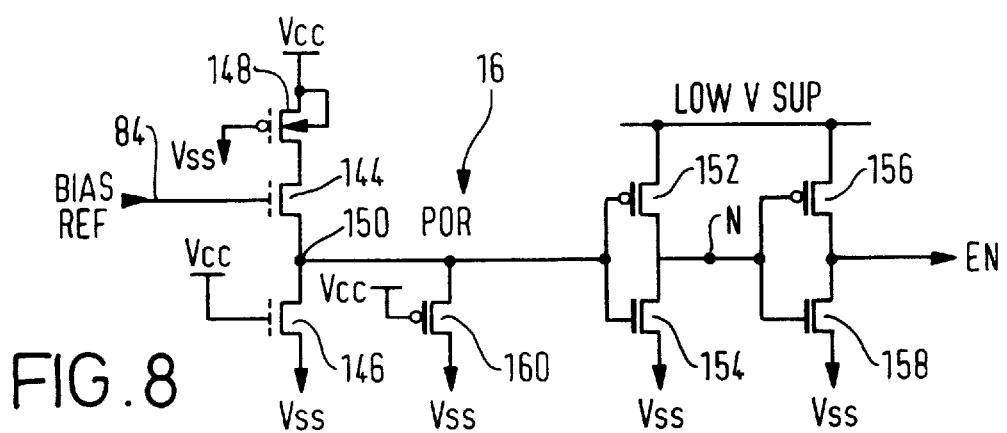
FIG. 8 is a transistor level diagram of an enable signal generating circuit.

Reference will now be made to FIG. 7 and 8 to describe in more detail how the bias reference signal and enable signal are generated.

FIG. 7 is a transistor level diagram of the bandgap comparator reference circuit, simplified to exclude the remaining detail of the start-up circuitry shown in FIG. 4 but illustrating in more detail the bias reference generating circuit 101. Like numerals in FIG. 7 denote like parts in FIG. 4.

As can be seen from FIG. 7, the bias generating circuit 101 includes first and second bias transistors 130,132 in the form of diode-connected n-channel MOSFETs. These are connected in series between the lower supply rail Vss and a bias reference output node 134. The bias reference generating circuit 101 further includes a third, resistive p-channel MOSFET 136 having its gate connected to the lower supply rail Vss, its source connected to the power supply rail Vcc and its drain connected to the drain of a resistive power-down p-channel transistor 138. The power down transistor 138 has its gate connected to receive the power-down signal PWD on line 57 and its drain connected to the bias reference output node 134.

FIG. 7 additionally illustrates further power-down control transistors in the form of a p-channel MOSFET 140 and n-channel MOSFET 142 connected in series between the power supply voltage rails Vcc and Vss and having their gates connected to receive the power-down signal PWD on line 57.

On application of the power supply voltage Vcc or after exiting a power-down mode, the bias reference signal on line 84 is low. As the power supply voltage Vcc increases, the bias reference signal rises slowly through the action of the p-channel transistors 136 and 138 until it reaches a level which is equal to the combined threshold voltages of the n-channel transistors 132 and 130 or Vcc, whichever is lower. It could be possible to utilise only one resistive p-channel device 136 and to omit device 138 depending on design parameters.

As described above, the bias reference signal on line 84 is supplied to enable logic 16. This will now be described in more detail with reference to FIG. 8. The bias reference signal on line 84 is supplied to the gate of a native input transistor 144. By native, this means that the device does not have a threshold implant and thus has a lower threshold voltage than a conventional MOSFET. Native transistors are denoted by a dotted line at the gate. The input transistor 144 has its source connected to a native n-channel resist transistor 146 which has its drain connected to the lower supply rail Vss and its gate connected to the power supply by rail Vcc. The source of the input transistor 144 is connected to the drain of a native p-channel detection transistor 148 which has its source connected to the power supply rail Vcc and its gate connected to the lower rail Vss. At the junction between the input transistor 144 and the resist transistor 146, denoted by reference numeral 150 a power-on reset signal POR is generated. This signal is supplied to a first inverter comprising transistors 152 and 154 connected in series between the output of the guaranteed power supply LOWV SUP and the lower supply rail Vss. The output of the first inverter is connected to the input of a second inverter which likewise comprises two transistors 156,158 connected in series between the output of the guaranteed power supply LOWV SUP and the lower rail Vss. The enable signal EN is taken from the output of the second inverter.

The enable logic also includes a reset transistor 160 which has its source connected to receive the power-on reset signal POR, its drain connected to the lower supply rail Vss and its gate connected to the upper power supply rail Vcc.

The enable logic 16 operates as follows.

Above a very small value of the power supply voltage Vcc, the resist transistor 146 will turn on, tending to pull the signal POR at node 150 low. Thus, even if the second power supply voltage Vpp is present so that the rail LOWV SUP is high, the signal POR will still be low and the first and second inverters will operate to ensure that the enable signal is low.

The native p-channel device 148 has a threshold voltage of about 1.7V so that for slow ramping power supplies (~1ms), for all values of the power supply voltage below 1.7V (when everything is unreliable), the enable signal will remain low. Thus, the comparators will be disabled. If native p-channel devices were not available, other devices could be used to achieve the same effect. For fast ramps, the ramp rate is such that Vcc virtually instantaneously attains its full level. For fast ramps ($\leq$ 1us) therefore, the device 148 could be omitted.

For values of the power supply voltage Vcc above about 1.7V, the state of the signal POR will depend on the state of the bias reference signal on line 84. When the bias reference signal has reached its high level (the threshold voltage of the two n-channel transistors 130,132 in FIG. 6, or Vcc whichever is the lower) then the signal POR will be pulled high through the action of the input transistor 144, provided of course Vcc is above 1.7V. Thus, the signal POR is high so that the output of the first inverter is low and the enable signal is high.

It will readily be apparent that the signal POR does not go high all the way to Vcc. Because the power supply to the first and second inverters LOWV SUP can be considerably above Vcc if the second power supply voltage Vpp is present, the first inverter is skewed by making the transistor 152 resistive. This ensures that the inverter can still be switched.

The enable logic 16 includes a reset device 160 which is only used when the power supply voltage Vcc fails. Normally, when the signal POR is less than the power supply voltage Vcc, the reset device 160 is off. However, if the power-on reset signal POR is above the power supply voltage Vcc, then the device will be turned on. Thus, the reset device clamps the POR signal to no more than one threshold voltage above the power supply voltage, even if the power supply voltage is zero. Assuming that the guaranteed power supply still provides power on line LOWV SUP, this would be sufficient to render the output of the first inverter high and therefore ensure that the enable signal remains low.

Figure 9:
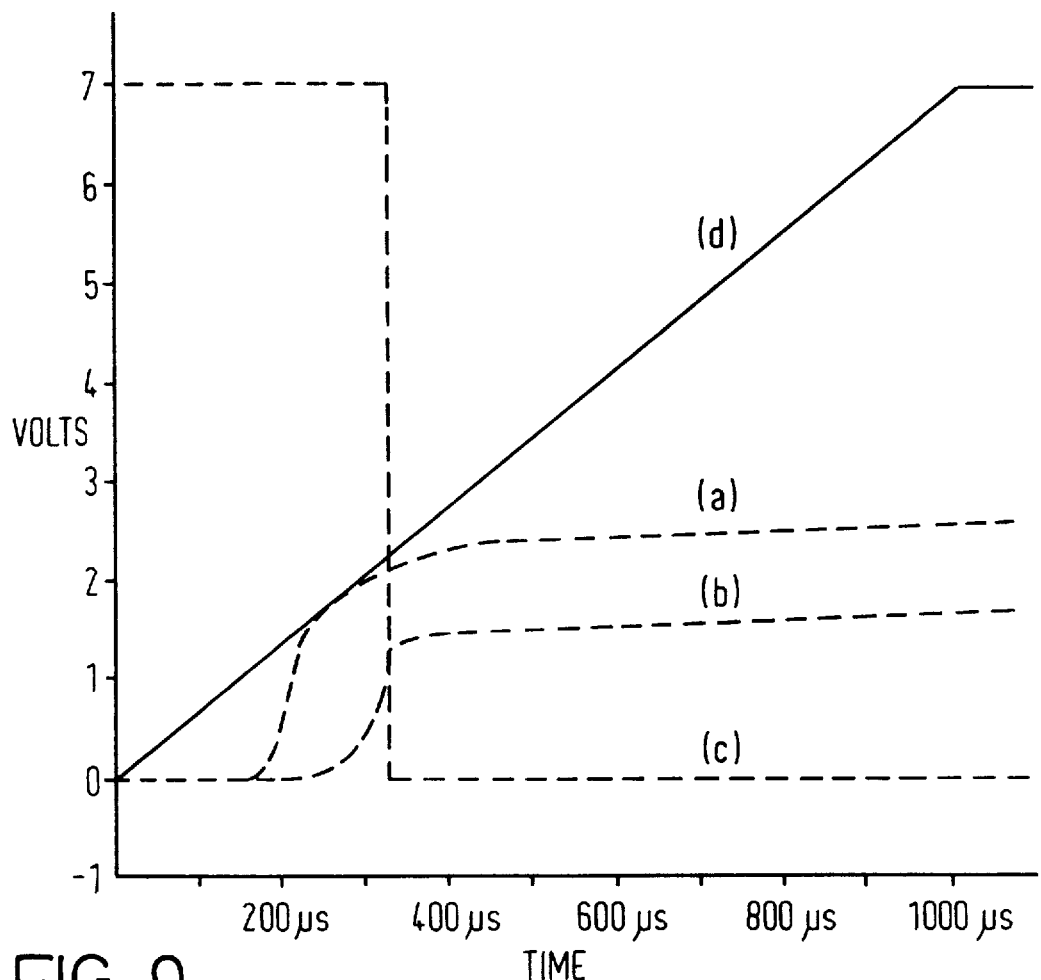
FIG. 9 is a graph of voltage against time for various signals.

Reference will now be made to FIG. 9 to illustrate further operation of the enable signal generating circuit of FIG. 8 on a slow ramp of 1ms. Graph (a) denotes the bias reference signal on line 84. Graph (b) denotes the power-on reset signal at node 150. Graph (c) denotes a signal taken at a node N between the first and second inverters of the enable signal generating circuit. Graph (d) denotes the power supply voltage Vcc. In FIG. 9, the power supply voltage Vcc is shown ramping up to 7V, although in practice it will normally ramp up only to 5V. The high level of the signal of graph (c) would change accordingly.

It will readily be appreciated that the enable signal output from the enable signal generating circuit will be the inverse of the signal shown in graph (c).

As can readily be seen from FIG. 9, the signal at node N between the first and second inverters of the enable signal generating circuit is at a high level initially. As the voltage Vcc shown in graph (d) ramps up, the bias reference signal on line 84 is at 0V initially and until Vcc reaches about 1.0V. It then starts to increase, following Vcc, until it reaches its second level of about 2.2V. This is shown in graph (a). When the power supply voltage Vcc exceeds 1.7V, and the bias reference signal is present above the threshold of the native n-channel input transistor 144 (nominally 0.4V), the power-on reset signal which has been at 0V starts to increase quickly to a value of about 1.2V. This is sufficient to cause the first inverter formed by transistors 152,154 to switch, causing the high level at node N to drop down to a low level as shown in graph (c). The final value of the bias reference signal is set by the threshold voltages of transistors 130,132. The threshold of transistor 154 is about 1V, i.e. similar to transistor 130. The input transistor 144 has a threshold of about 0.4V, i.e. less than transistor 132. The sizes of transistors 152 and 154 are selected so that transistor 154 will pull node N down even with a relatively low voltage of 1.2V on its gate. The level of POR is sufficient to turn on transistor 154 because transistor 144 is a native transistor with a lower threshold than the normal transistor 132 which as explained above partially determines the level of bias reference.

What is claimed is:

1. A reference circuit arranged to generate at a reference node a reference voltage which reference circuit includes start-up circuitry for starting up said reference circuit wherein said start-up circuitry includes an analogue signal reference generating circuit for generating an analogue reference signal which is at a first level in a power-down state and which changes after initiating a power-up state to a second level indicative that adequate start-up conditions have been established; and an enable signal generating circuit responsive to said analogue reference signal for generating an enable signal when said analogue reference signal is at the second level.

2. A reference circuit according to claim 1 which is connected between upper and lower power supply rails and wherein said power-up state can be initiated by applying a power supply potential between said upper and lower power supply rails.

3. A reference circuit according to claim 1 or 2 which has a power-up/power-down detection device responsive to a power-down signal to change between said power-up and said power-down state.

4. A reference circuit according to claim 1 or 2 wherein the analogue signal reference generating circuit includes a first resistive transistor connected between a first voltage and a reference output node and a second diode connected transistor connected between a second voltage and said reference output node, whereby said analogue reference signal increases as the first voltage increases from a power-down level, said second level being determined by the threshold voltage of the diode connected transistor.

5. A reference circuit according to claim 4 wherein the first voltage is a power supply voltage and the second voltage is ground.

6. A reference circuit according to claim 1 wherein the enable signal generating circuit includes a detection device for generating the enable signal only when the power supply voltage exceeds a predetermined level.

7. A reference circuit according to claim 1 wherein the reference voltage changes during start-up from a power down level to a stable reference value and which includes:

- a lock signal generating circuit for generating a lock signal which is maintained at a first logic level during start-up of the reference circuit and then attains a second logic level when the reference value has stabilised; and
- a lock transistor having a controllable node connected to receive said lock signal and a controllable path connected between a start-up voltage level and said reference node, said start-up voltage level being at least as high as said stable reference value whereby the reference voltage is held at said start-up voltage level during start-up of the circuit.

8. A reference circuit according to claim 7 wherein the lock transistor is a p-channel MOSFET transistor with its gate connected to receive the lock signal, its source connected to the start-up voltage level and its drain connected to the reference node.

9. A reference circuit according to claim 7 or 8 wherein the lock signal generating circuit includes start-up circuitry for generating a start-up signal at said first logic level during start-up and a lock generator comprising first and second inverters, the first inverter being coupled to receive said start-up signal and the second inverter arranged to generate said lock signal.

10. A reference circuit according to claim 9 wherein the first logic level is low and wherein the first inverter is skewed to have a high trip point so that the start-up signal does not have to go fully low to activate the lock generator.

11. A reference circuit according to claim 1 which is a bandgap reference circuit arranged to generate said reference voltage derived from a feedback reference level at the reference node.

12. A voltage detection circuit comprising a reference circuit arranged to generate at a reference node a reference voltage which reference circuit includes start-up circuitry for starting up said reference circuit wherein said start-up circuitry includes an analogue signal reference generating circuit for generating an analogue reference signal which is at a first level in a power-down state and which changes after initiating a power-up state to a second level indicative that adequate start-up conditions have been established;

- an enable signal generating circuit responsive to said analogue reference signal for generating an enable signal when said analogue reference signal is at the second level; and
- a comparator for receiving at one input an input voltage derived from a voltage to be detected and at another input said reference voltage and operable to compare said input voltage with said reference voltage.

13. A voltage detection circuit according to claim 12 wherein the enable signal generating circuit is operable to disable the comparator until the reference circuit has started up.

14. A voltage detection circuit according to claim 12 or 13 wherein said comparator derives its input voltage from a power supply voltage and is arranged to supply an output signal when the power supply voltage falls below an adequate level.

15. A voltage detection circuit according to claim 12 or 13 which comprises a second comparator operable to compare said reference voltage with a second input voltage different to said first-mentioned input voltage.

16. A voltage detection circuit according to claim 15 wherein the second input voltage is derived from a power supply voltage and is arranged to produce an output signal indicative of the range of voltages within which said power supply voltage falls.

17. A voltage detection circuit according to claim 12 which comprises a further comparator operable to compare said reference voltage with a further input voltage to generate a detection signal when said further input voltage falls below an adequate level.

18. A voltage detection circuit according to claim 17 wherein said further input voltage is derived from a second power supply voltage.

* * * * *